United States Patent
Norcross et al.

(10) Patent No.: US 11,330,370 B2
(45) Date of Patent: May 10, 2022

(54) LOUDNESS CONTROL METHODS AND DEVICES

(71) Applicant: Dolby Laboratories Licensing Corporation, San Francisco, CA (US)

(72) Inventors: Scott Gregory Norcross, San Rafael, CA (US); Michael Grant, San Francisco, CA (US); James Stuart Cowdery, Moss Beach, CA (US); Sachin Nanda, San Francisco, CA (US); Nisarg Vipul Shah, Dublin, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 82 days.

(21) Appl. No.: 16/969,907

(22) PCT Filed: Feb. 15, 2019

(86) PCT No.: PCT/US2019/018207
§ 371 (c)(1),
(2) Date: Aug. 13, 2020

(87) PCT Pub. No.: WO2019/161191
PCT Pub. Date: Aug. 22, 2019

(65) Prior Publication Data
US 2021/0120337 A1  Apr. 22, 2021

Related U.S. Application Data

(60) Provisional application No. 62/631,227, filed on Feb. 15, 2018.

(30) Foreign Application Priority Data
Feb. 15, 2018 (EP) .................................. 18156935

(51) Int. Cl.
*H04R 3/04* (2006.01)
*G10L 19/008* (2013.01)
(Continued)

(52) U.S. Cl.
CPC .............. *H04R 3/04* (2013.01); *G10L 19/008* (2013.01); *H03G 5/165* (2013.01); *H03G 9/005* (2013.01)

(58) Field of Classification Search
CPC ........ H04R 3/04; G10L 19/008; H03G 5/165; H03G 9/005
See application file for complete search history.

(56) References Cited

U.S. PATENT DOCUMENTS 8,774,417 B1 * 7/2014 Cabot .................... H04S 5/005
381/18
9,154,102 B2  10/2015 Wolters
(Continued)

FOREIGN PATENT DOCUMENTS

WO  2016057530 A1  4/2016

OTHER PUBLICATIONS

ITU-R BS.1770-4 "Algorithms to Measure Audio Programme Loudness and True-Peak Audio Level" Oct. 2015.
(Continued)

*Primary Examiner* — Fan S Tsang
*Assistant Examiner* — Daniel R Sellers

(57) ABSTRACT

Audio data in a first format may be processed to produce audio data in a second format, which may be a reduced or simplified version of the first format. A loudness correction process may produce loudness-corrected audio data in the second format. A first power of the audio data in the second format and a second power of the loudness-corrected audio data in the second format may be determined. A second-format loudness correction factor for the audio data in the (Continued)

second format may be based, at least in part, on a power ratio between the first power and the second power. A first-format loudness correction factor for the audio data in the first format may be based, at least in part, on the power ratio and a power relationship between the audio data in the first format and the audio data in the second format.

20 Claims, 13 Drawing Sheets

(51) Int. Cl.
*H03G 5/16* (2006.01)
*H03G 9/00* (2006.01)

(56) References Cited

U.S. PATENT DOCUMENTS

| | | | |
|---|---|---|---|
| 9,312,829 B2 | 4/2016 | Tracey | |
| 2004/0032960 A1* | 2/2004 | Griesinger | H04S 3/02 381/104 |
| 2006/0002572 A1* | 1/2006 | Smithers | H03G 9/005 381/104 |
| 2009/0028360 A1 | 1/2009 | Griesinger | |
| 2014/0294200 A1 | 10/2014 | Baumgarte | |
| 2015/0078585 A1 | 3/2015 | Reilly | |
| 2015/0170657 A1 | 6/2015 | Thompson | |
| 2015/0245153 A1 | 8/2015 | Malak | |
| 2015/0332685 A1 | 11/2015 | Bleidt | |
| 2015/0348564 A1 | 12/2015 | Paulus | |
| 2015/0373473 A1 | 12/2015 | Boehm | |
| 2016/0066114 A1 | 3/2016 | Skovenborg | |
| 2016/0219387 A1 | 7/2016 | Ward | |
| 2016/0219391 A1* | 7/2016 | Ward | G10L 19/008 |
| 2016/0254001 A1 | 9/2016 | Paulus | |
| 2017/0249950 A1 | 8/2017 | Hoerich | |

OTHER PUBLICATIONS

Norcross S.G. et al. "Practical Loudness Measurement and Management for Immersive Audio", AES Engineering Brief #352, May 2017.

* cited by examiner

LOUDNESS CONTROL METHODS AND DEVICES

TECHNICAL FIELD

This disclosure relates to the processing of audio signals. In particular, this disclosure relates to processing audio signals to manage and control loudness.

BACKGROUND

Loudness management of programs is now an essential part of the broadcast industry and therefore the measurement or correction of loudness for such programs is commonplace. This is due in part to various recommendations promulgated by the Radiocommunications Sector of the International Telecommunication Union (ITU-R), particularly Recommendation ITU-R BS.1770, which is the basis for various regulations that are being implemented globally. The loudness measurements are generally based either on the average speech or dialog loudness, or on the average full-mix (all channels using the relative level gated as described in BS.1770) of the program.

SUMMARY

Various audio processing methods are disclosed herein. One such method may involve receiving audio data in a first format and processing the audio data in the first format to produce audio data in a second format. The second format may be, or may include, a reduced or simplified version of the first format. The method may involve performing a loudness correction process on the audio data in the second format to produce loudness-corrected audio data in the second format. The method may involve determining a first power of the audio data in the second format and determining a second power of the loudness-corrected audio data in the second format. The method may involve determining a second-format loudness correction factor for the audio data in the second format. The second-format loudness correction factor may be based, at least in part, on a power ratio of the first power to the second power.

In some examples, the method may involve determining a power relationship between the audio data in the first format and the audio data in the second format. The method may involve determining a first-format loudness correction factor for the audio data in the first format, the first-format loudness correction factor may be based, at least in part, on the power ratio and the power relationship. The method may involve outputting the first-format loudness correction factor and the second-format loudness correction factor.

According to some examples, the first format may be a first channel-based format. In some such examples, the second format may be a downmix of the first channel-based format. In some examples, the power relationship may correspond to a difference between a power of the audio data in the first channel-based format and a power of the audio data of the downmix.

In some implementations, the first format may include audio data for height speakers. According to some such implementations, the second format may not include audio data for height speakers. In some examples, the power relationship may correspond to a power of the audio data for the height speakers.

According to some implementations, the loudness correction process may involve a first loudness measurement process, a loudness adjustment process and a second loudness measurement process. The first loudness measurement process may, for example, involve one or more linear processing operations, followed by a mixing operation, followed by one or more non-linear processing operations. In some examples, the linear processing operations may include applying a K-weighting filter and applying a spatial gain. According to some examples, the mixing operation may include a downmixing operation that produces third audio data in a third format. The third format may, for example, be a reduced or simplified version of the second format. According to some implementations, the audio data in the second format may include dialogue audio data and music and audio effects (M&E) audio data. In some implementations, the dialogue audio data may include dialogue audio data for a plurality of languages. The linear processing operations may, for example, be performed separately on the dialogue audio data for each of the plurality of languages. According to some examples, the linear processing operations for the M&E audio data may be performed separately from the linear processing operations for the dialogue audio data. According to some implementations, the audio data in the first format may include at least a first dialogue and M&E audio data.

In some examples, the first format may be an audio object format. The second format may, for example, be a simplified version of the audio object format.

Various alternative audio processing methods are disclosed herein. One such method may involve receiving a first-format loudness correction factor for audio data in a first format and a second-format loudness correction factor for audio data in a second format. The second-format loudness correction factor may be referred to herein as a "received second-format loudness correction factor," in order to distinguish the received second-format loudness correction factor from an adjusted or modified second-format loudness correction factor.

The method may involve receiving the audio data in the first format and receiving an indication of a revised power relationship between the audio data in the first format and the audio data in the second format. In some examples, the method may involve adjusting the received second-format loudness correction factor based, at least in part, on the first-format loudness correction factor and the revised power relationship.

According to some examples, the audio data in the second format may be a downmix or a render of the audio data in the first format. The second format may, for example, be a Dolby 5.1 format and the first format may be a Dolby 5.1.2 format. In some alternative implementations, the second format may be a Dolby 5.1 format and the first format may be a Dolby 7.1.4 format.

In some implementations, the revised power relationship may be an alteration of an original power relationship. According to some implementations, the original power relationship may indicate how a level of audio data corresponding with a channel of the first format has been altered during a downmixing process that produced the audio data in the second first format.

Some or all of the methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, various innovative aspects of the subject matter described in this disclosure can be implemented in one or more non-transitory media having software stored thereon. The software may, for example, include instructions for controlling at least one device to process audio data. The software may, for example, be executable by one or more components of a control system such as those disclosed herein.

At least some aspects of the present disclosure may be implemented via apparatus. For example, one or more devices may be configured for performing, at least in part, the methods disclosed herein. In some implementations, an apparatus may include an interface system and a control system. The interface system may include one or more network interfaces, one or more interfaces between the control system and a memory system, one or more interfaces between the control system and another device and/or one or more external device interfaces. The control system may include at least one of a general purpose single- or multi-chip processor, a digital signal processor (DSP), an application specific integrated circuit (ASIC), a field programmable gate array (FPGA) or other programmable logic device, discrete gate or transistor logic, or discrete hardware components.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DESCRIPTION OF EXAMPLE EMBODIMENTS

Figure 1:
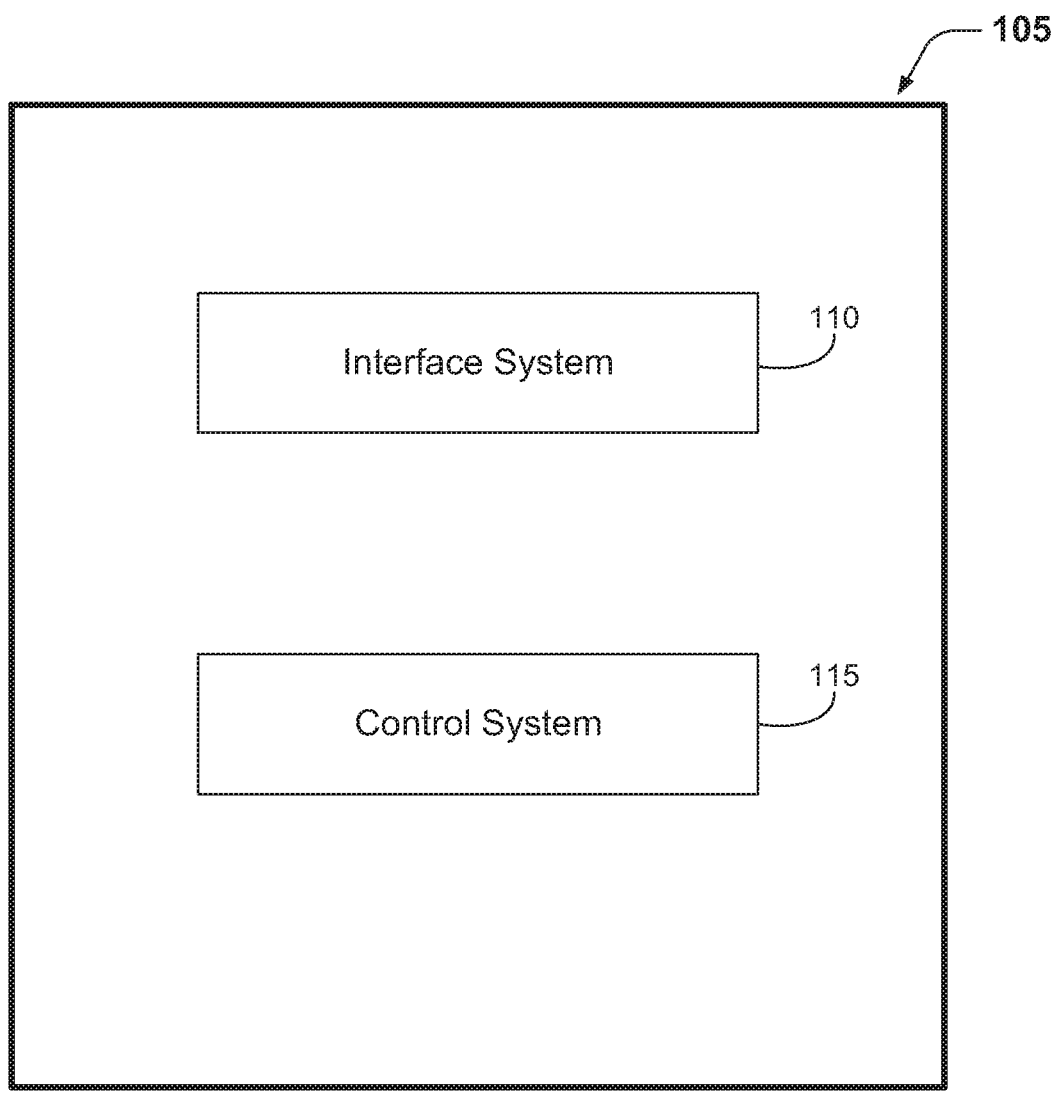
FIG. 1 is a block diagram that shows examples of components of an apparatus that may be configured to perform at least some of the methods disclosed herein.

The following description is directed to certain implementations for the purposes of describing some innovative aspects of this disclosure, as well as examples of contexts in which these innovative aspects may be implemented. For example, while many examples disclosed herein will specifically reference Dolby 5.1 format, these examples are not intended to be limiting. Instead, these examples are merely instances that could be implemented via any suitable format. However, the teachings herein can be applied in various different ways. Moreover, the described embodiments may be implemented in a variety of hardware, software, firmware, etc. For example, aspects of the present application may be embodied, at least in part, in an apparatus, a system that includes more than one device, a method, a computer program product, etc. Accordingly, aspects of the present application may take the form of a hardware embodiment, a software embodiment (including firmware, resident software, microcodes, etc.) and/or an embodiment combining both software and hardware aspects. Such embodiments may be referred to herein as a "circuit," a "module," an "engine," a "process" or a "block." Some aspects of the present application may take the form of a computer program product embodied in one or more non-transitory media having computer readable program code embodied thereon. Such non-transitory media may, for example, include a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. Accordingly, the teachings of this disclosure are not intended to be limited to the implementations shown in the figures and/or described herein, but instead have wide applicability.

As noted above, loudness management is now an essential part of the broadcast industry. In broadcast today, the full program mix is measured. In a legacy channel-based example, if the audio for a program is in Dolby Surround 5.1 format (which may also be referred to herein as "Dolby 5.1" or simply "5.1"), the full 5.1 mix that will be delivered and played back to the consumer/user may be measured for loudness management. For example, the audio for a program may include a 5.1 channel or 2-channel stereo mix where each contains all the elements, Music and Effects (M&E) and dialog. The complete audio program or presentation is present and this is what will be delivered and played back to the listener. Delivering the exact mix with what the listener will receive allows more control over the program characteristics such as loudness. One is able to measure, correct and normalize the loudness of the delivered program by carrying out those processes on the program prior to delivering it.

Multiple language and/or audio description support is required in many broadcasting regions. Because broadcasters may be required to ensure that all the programs meet the required loudness regulations, numerous loudness measurements may be required in addition to the extra bandwidth that is needed to carry the additional programs. Some broadcasters may provide the main service (e.g., for a country's most widely-spoken language) in a multi-channel format, but additional languages or video description services may only be carried as stereo programs.

In some examples, the audio for a program may include "audio objects." The audio objects may include audio data (which may be mono audio data) and associated metadata. The metadata may, for example, include data indicating the position, size and/or trajectory of an audio object in a three-dimensional space, etc. The audio objects may be agnostic as to the type of reproduction system on which the audio will eventually be reproduced: the audio objects may be rendered to speaker feed signals according to the capabilities of the reproduction system.

With next-generation audio systems, the final mix may not be what is delivered to the consumer/user. In the case of object-based audio, the audio objects may be delivered with information (e.g., in the form of metadata) regarding how the audio objects should be reproduced at the playback side, but a final mix of the audio may not be delivered. This approach allows for more efficient encoding of the audio for multiple playback scenarios, such as multiple language support and audio description. However, this approach leads to challenges regarding how loudness measurement and/or correction is done. One such challenge is complexity, meaning that more loudness measurements will generally need to take place.

In many instances or applications, a precise/accurate loudness measurement is not required. One such case is with real-time loudness correction, where an attempt is made to correct the loudness of a program based on the current short-term characteristics of the program.

For file-based loudness correction of an entire program, the loudness or average loudness of the entire program may first be measured, and the result may be used to correct/normalize the file according to the result. For a program that is delivered in one format, but can be reproduced in various formats (such as Dolby 7.1.4 or object-based audio), the loudness measurement of one, (such as the loudness measurement of the Dolby Surround 5.1 version) may be used to correct for all playback environments due to the loudness consistency of the various playback configurations.

For real-time loudness correction, wherein the program audio may be adjusted/corrected on a shorter time scale than the entire program (e.g., on the order of seconds), more frequent loudness measurements need to be done. Therefore, methods to reduce the complexity of measurements of the audio are desired. Processing based on short-term measurements, including loudness, of the audio data may be used to modify/adjust the audio in real-time so that the resulting audio meets a desired level or characteristic.

In some cases, it may not be desirable to modify or destructively alter the audio directly, but instead it may be desirable to calculate information (such as metadata) that can be used further downstream to correct/process the audio. In some instances, the reason for this is that "better" processing, including but not limited to analysis and/or measurement, may be accomplished by a downstream process. In some examples, the reason is that at least some of the audio playback parameters may not be fully defined until the program is being processed for reproduction. This may be the case when a program is provided via object-based audio or via M&E plus multiple dialogues. In such instances, the processing of the audio will generally be done at the time of playback, e.g., in a playback device.

In view of the foregoing, some aspects of the present disclosure can provide improved methods for audio processing. FIG. 1 is a block diagram that shows examples of components of an apparatus that may be configured to perform at least some of the methods disclosed herein. In some examples, the apparatus 105 may be device that is configured to provide audio processing for a broadcasting enterprise, whereas in other examples the apparatus 105 may be device that is configured to provide audio processing for a reproduction environment. In some implementations, the apparatus 105 may be device that is configured to provide audio processing for a device in a network, such as a device that receives audio data from a broadcasting enterprise and provides processed audio data to a reproduction environment.

The components of the apparatus 105 may be implemented via hardware, via software stored on non-transitory media, via firmware and/or by combinations thereof. The types and numbers of components shown in FIG. 1, as well as other figures disclosed herein, are merely shown by way of example. Alternative implementations may include more, fewer and/or different components.

In this example, the apparatus 105 includes an interface system 110 and a control system 115. The interface system 110 may include one or more network interfaces, one or more interfaces between the control system 115 and a memory system and/or one or more external device interfaces (such as one or more universal serial bus (USB) interfaces). In some implementations, the interface system 110 may include a user interface system. The user interface system may be configured for receiving input from a user. In some implementations, the user interface system may be configured for providing feedback to a user. For example, the user interface system may include one or more displays with corresponding touch and/or gesture detection systems. In some examples, the user interface system may include one or more speakers. According to some examples, the user interface system may include apparatus for providing haptic feedback, such as a motor, a vibrator, etc. The control system 115 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In some examples, the apparatus 105 may be implemented in a single device. However, in some implementations, the apparatus 105 may be implemented in more than one device. In some such implementations, functionality of the control system 115 may be included in more than one device. In some examples, the apparatus 105 may be a component of another device.

Figure 2:
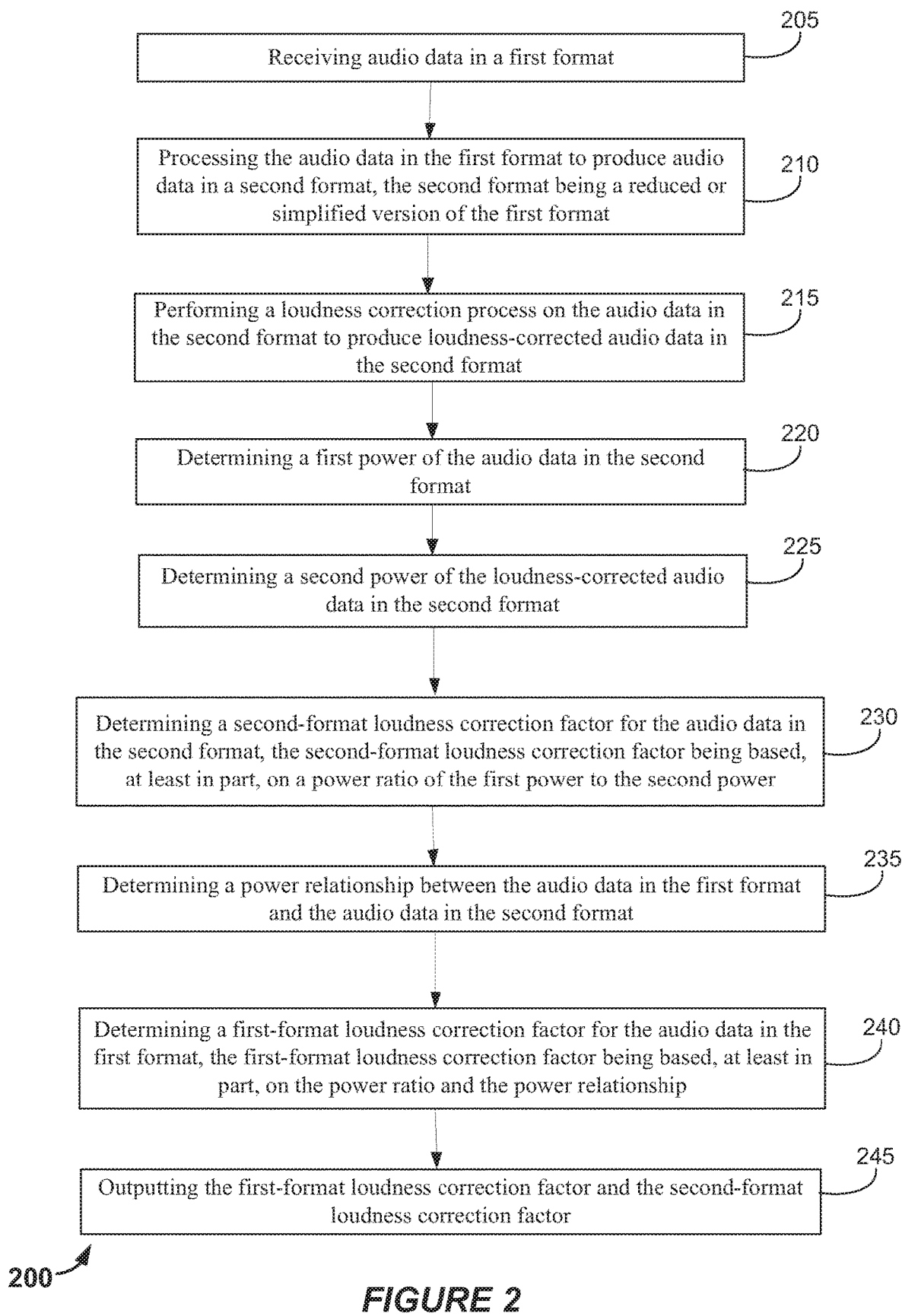
FIG. 2 is a flow diagram that outlines blocks of a method according to one example.

FIG. 2 is a flow diagram that outlines blocks of a method according to one example. The method may, in some instances, be performed by the apparatus of FIG. 1 or by another type of apparatus disclosed herein. In some examples, the blocks of method 200 may be implemented via software stored on one or more non-transitory media. The blocks of method 200, like other methods described herein, are not necessarily performed in the order indicated. Moreover, such methods may include more or fewer blocks than shown and/or described.

In this implementation, block 205 involves receiving audio data in a first format. Block 205 may, for example, involve a control system (such as the control system 115 of FIG. 1) receiving audio data in the first format via an interface system (such as the interface system 110 of FIG. 1).

For audio signals with multiple channels, multiple objects or components of an high-order Ambisonics (HOA) stream, processing on a reduced number of channels or streams may be desired due to complexity reasons. Knowing the relationship between the full and reduced representation of the audio may be used to approximate the processing or the metadata representation of that processing that would have been done on the full representation when that relationship is applied to the processed representation.

Therefore, according to this implementation, block 210 involves processing the audio data in the first format to produce audio data in a second format. In this example, the second format is a reduced or simplified version of the first format.

According to some such examples, the first format may include audio data for "height channels," such as channel-based or object-based information corresponding to height or ceiling speakers of a reproduction environment. The second format may not include audio data for height speakers. In some implementations, the first format may be an audio object format. The second format may be a simplified version of the audio object format. In some channel-based implementations, the first format may be a first channel-based format and the second format may be a downmix of the first channel-based format. In some examples, the audio data in the first format and/or the second format may include dialogue audio data and music and audio effects (M&E) audio data. Some detailed examples are described below.

In this implementation, block 215 involves performing a loudness correction process on the audio data in the second format to produce loudness-corrected audio data in the second format. In some examples, the loudness correction process may involve a first loudness measurement process, a loudness adjustment process and a second loudness measurement process. The first loudness measurement process may be compliant with Recommendation ITU-R BS.1770.

According to some such examples, the first loudness measurement process may involve one or more linear processing operations, followed by a mixing operation, followed by one or more non-linear processing operations. For example, the linear processing operations may include applying a K-weighting filter and applying a spatial gain. According to some examples, the mixing operation may include a downmixing operation that produces third audio data in a third format. The third format may be a reduced or simplified version of the second format.

In the example shown in FIG. 2, block 220 involves determining a first power of the audio data in the second format and block 225 involves determining a second power of the loudness-corrected audio data in the second format. The terms "first power" and "second power" are merely terms used to differentiate the power of the audio data in the second format from the power of the loudness-corrected audio data in the second format and are not intended to convey, for example, a temporal relationship between the "first power" and the "second power." Determining the first power and the second power may, for example, involve calculating the root mean square of the audio data during a time interval.

According to this implementation, block 230 involves determining a power ratio of the first power to the second power. In this example, block 230 involves determining a loudness correction factor for the audio data in the second format. The loudness correction factor for the audio data in the second format will be referred to herein as a "second-format loudness correction factor." Here, the second-format loudness correction factor is based, at least in part, on the power ratio.

According to this example, block 235 involves determining a power relationship between the audio data in the first format and the audio data in the second format. According to some examples wherein the first format is a channel-based format and the second format is a downmix of the first channel-based format, the power relationship may correspond to a difference between (or a ratio of) a power of the audio data in the first channel-based format and a power of the audio data of the downmix. In some examples, the power relationship may be indicated by information, such as metadata, that is included with the audio data in the first format. For example, the power relationship may correspond with the power to be provided to height speakers when audio data in the first format are reproduced.

In this example, block 240 involves determining a loudness correction factor for the audio data in the first format. The loudness correction factor for the audio data in the first format will be referred to herein as a "first-format loudness correction factor." In this implementation, the first-format loudness correction factor is based, at least in part, on the power ratio and the power relationship. According to this example, block 245 involves outputting the first-format loudness correction factor and the second-format loudness correction factor.

Figure 3:
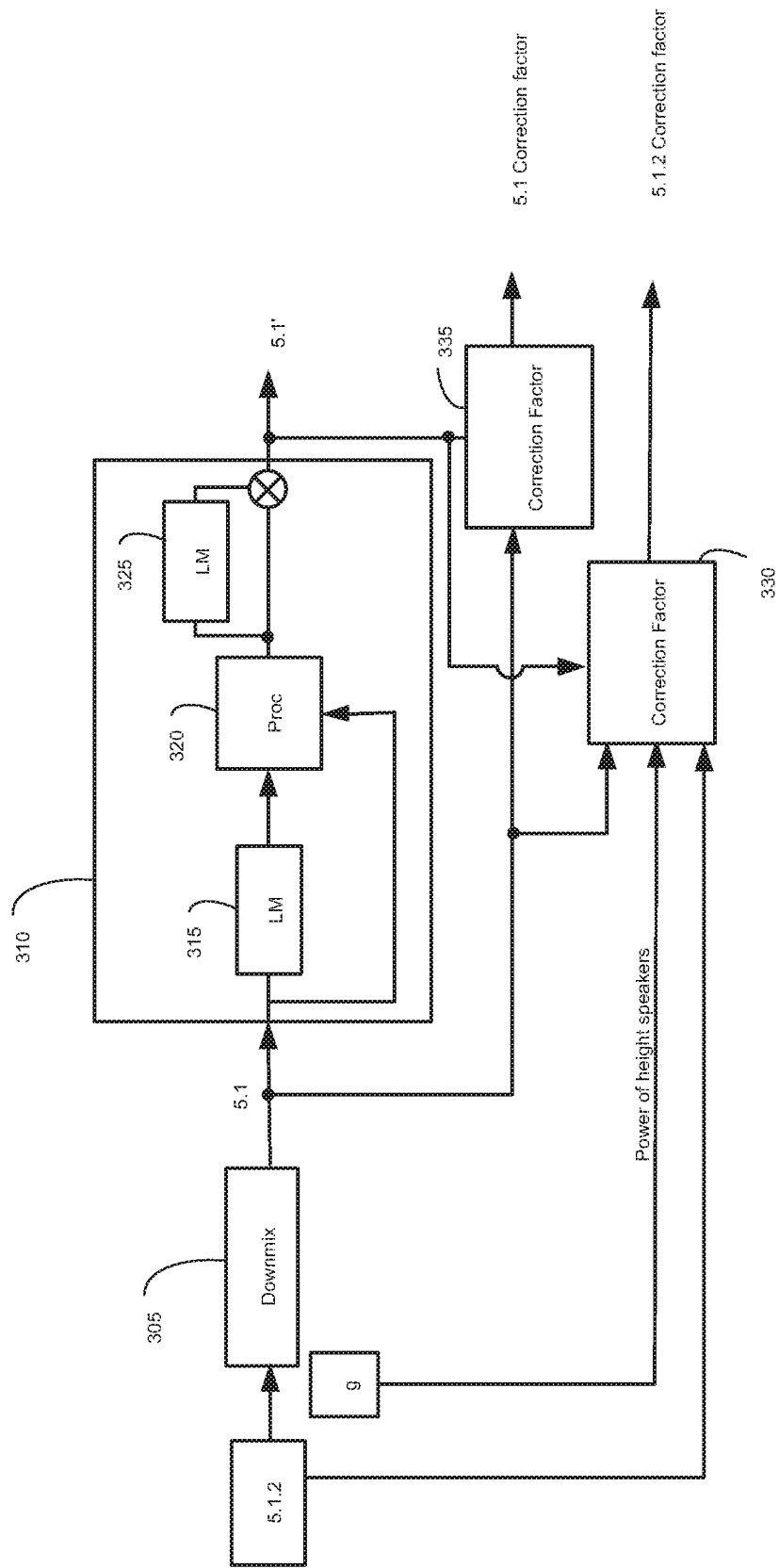
FIG. 3 is a block diagram that shows an example of the method of FIG. 2.

FIG. 3 is a block diagram that shows an example of the method of FIG. 2. The blocks of FIG. 3, as with blocks of other drawings disclosed herein, may be performed by hardware, by software (e.g., according to software stored on one or more non-transitory media), firmware, and/or combinations thereof. According to this example, the audio data in the first format, which is Dolby 5.1.2 in this instance, are received by downmixing block 305. This is an example of block 205 of FIG. 2.

In this implementation, the audio data in the first format is downmixed to produce audio data in a second format, which is Dolby 5.1 in this example. This is an example of block 210 of FIG. 2.

As known by those of ordinary skill in the art, the Dolby 5.1 format includes a left screen channel, a center screen channel, a right screen channel, a left surround channel and a right surround channel, which collectively correspond to the "5" of the Dolby 5.1 format. The Dolby 5.1 format also includes a separate channel for low-frequency effects (LFE), which corresponds to the "0.1" of the Dolby 5.1 format. The Dolby 5.1.2 format includes all of the channels of the Dolby 5.1 format, plus two height channels for height speakers, which may be ceiling speakers in some instances. These two extra height channels correspond to the "0.2" of the Dolby 5.1.2 format.

Accordingly, the audio data input to the downmixing operation that is illustrated in FIG. 3 is in a first format that includes height speaker channels, whereas audio data that is output from the downmixing operation is in a second format does not include height channels. In this example, "g" is a factor that may be used in the downmixing operation. The value of "g" may correspond to the relative power of height speakers as compared to the power of other channels of the 5.1.2-formatted audio data. Accordingly, the value of "g" may indicate how the power of the height channel audio data of the first audio format will be distributed to the remaining channels of the second audio format during the downmixing operation. The value of g may, for example, be set by a content creator or by another person involved in producing the 5.1.2-formatted audio data.

In the example shown in FIG. 3, the audio data that is output from the downmixing operation in the second format is provided to a loudness correction block 310, which is configured to produce loudness-corrected audio data in the second format. The loudness-corrected audio data in the second format is labeled 5.1' in FIG. 3. This process is an example of block 215 of FIG. 2.

According to this example, the loudness correction block 310 includes loudness measurement blocks 315 and 325, as well as a loudness adjustment block 320. In some examples, the loudness measurement blocks 315 and 325 may be configured in compliance with Recommendation ITU-R BS.1770. According to some such examples, the loudness measurement blocks 315 and 325 may be configured according to Annex 1 of Recommendation ITU-R BS.1770, which is hereby incorporated by reference. However, in alternative implementations loudness measurement blocks 315 and 325 may be configured to apply other loudness measurement processes.

Figure 4A:
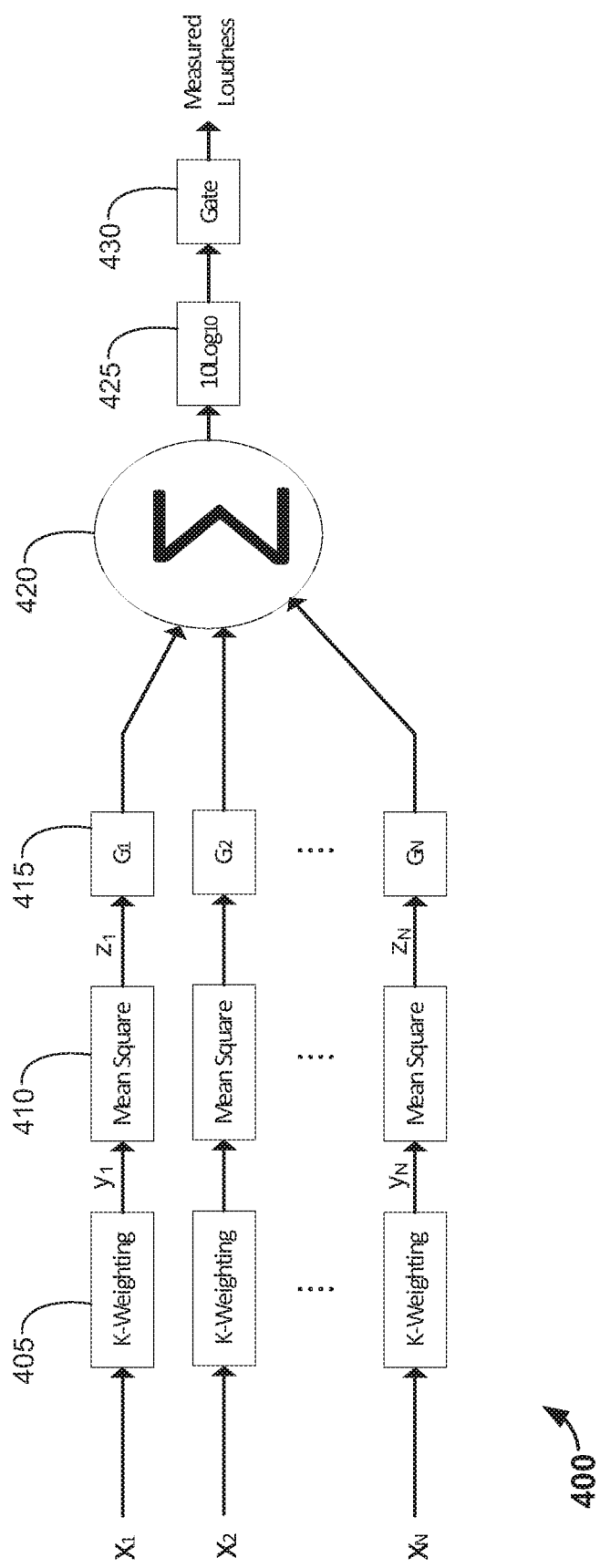
FIG. 4A is a block diagram that represents the loudness measurement process outlined in Annex 1 of Recommendation ITU-R BS.1770 ("Annex 1").

FIG. 4A is a block diagram that represents the loudness measurement process outlined in Annex 1 of Recommendation ITU-R BS.1770 ("Annex 1"). FIG. 4A shows individual input channels $X_1$-$X_N$ being input for loudness measurement. In the example shown in FIG. 3, the loudness measurement would be based on five input channels: according to the loudness measurement process outlined in Annex 1, the LFE channel of Dolby 5.1 is not included in the measurement.

Figure 4B:
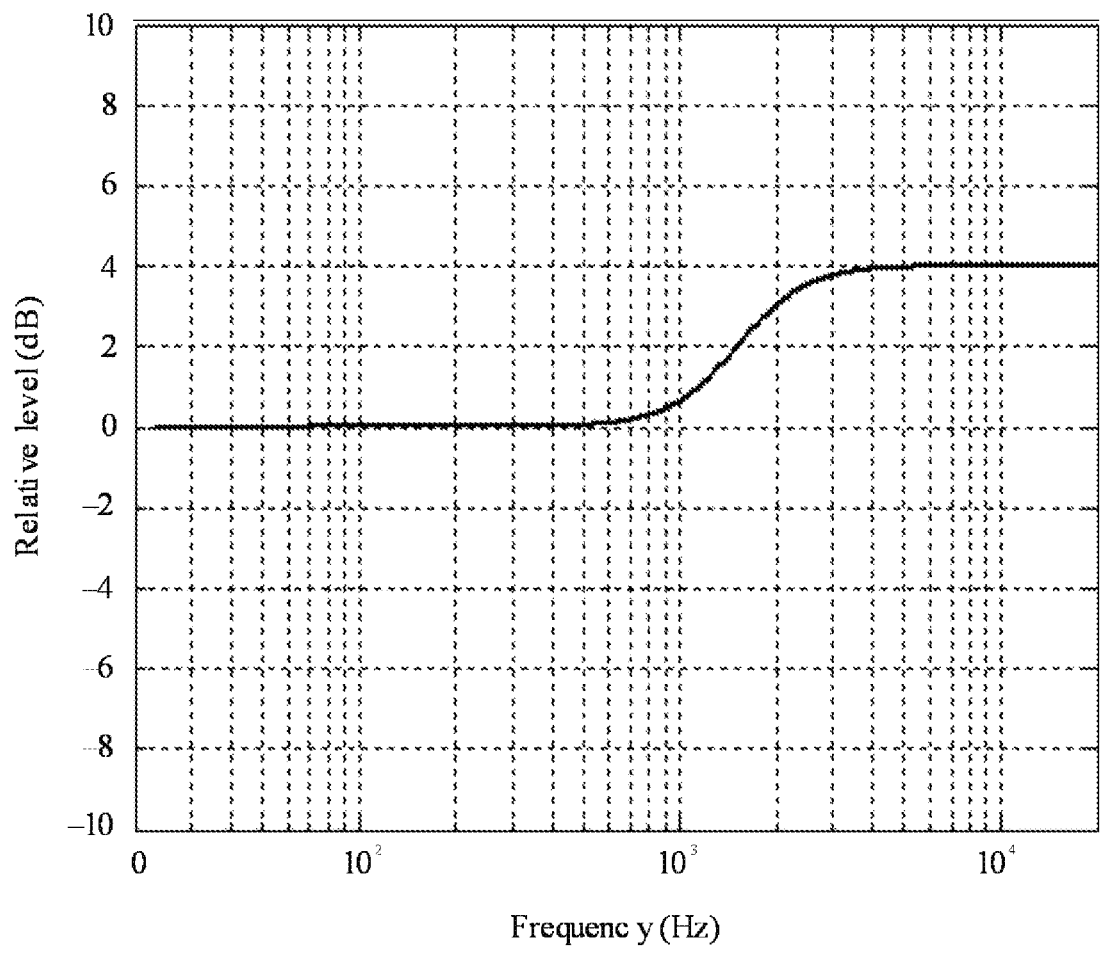
FIG. 4B shows the frequency response of the shelving filter disclosed in Annex 1.
Figure 4C:
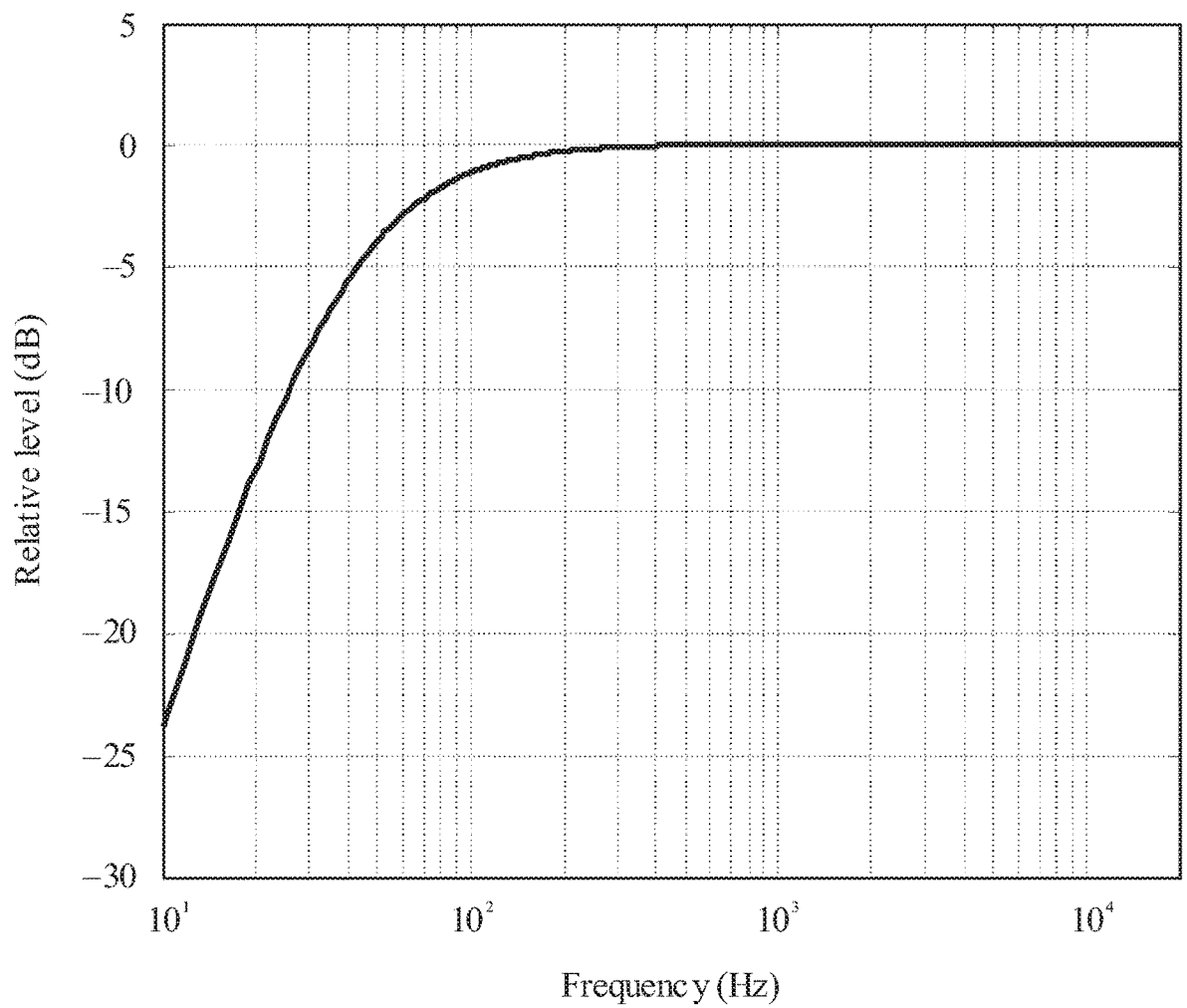
FIG. 4C shows the frequency response of the high-pass filter disclosed in Annex 1.

In this example, a linear K-weighting process is applied to each of the N channels by K-weighting blocks 405, to produce filtered signals $y_1$-$y_N$. Here, the K-weighting process includes a first stage in which a shelving filter is applied and a second stage in which a high-pass filter is applied. The shelving filter accounts for the acoustic effects of the head, wherein the head is modelled as a rigid sphere. FIG. 4B shows the frequency response of the shelving filter disclosed in Annex 1. FIG. 4C shows the frequency response of the high-pass filter disclosed in Annex 1. In alternative implementations, one or more other types of frequency weighting may be applied in block 405. For example, some implementations may involve applying an A-weighting or an M-weighting process. According to some alternative examples, block 405 may include another type of linear processing, such as applying a gain to one or more channels, applying a time delay, etc.

Returning to FIG. 4A, in this example the next phase of the loudness measurement process 400 is represented by the power determination blocks 410, in which the mean square of the filtered signals $y_1$-$y_N$ is determined. The mean square $z_i$ of the filtered signals $y_1$-$y_N$ in a measurement interval T may be measured as follows:

$$z_i = \frac{1}{T}\int_0^T y_i^2 dt \quad \text{(Equation 1)}$$

In blocks 415, weighting coefficients G are applied to mean square values $z_1$-$z_N$ output by the power determination blocks 410. The results of blocks 415 are summed in block 420 and the loudness calculation over the measurement interval T is completed in blocks 425 and 430. In this example, as in Annex 1, the loudness $L_k$ is determined as follows:

$$L_K = -0.691 + 10\log_{10}\sum_i G_i \cdot z_i \quad \text{(Equation 2)}$$

To calculate a gated loudness measurement according to Annex 1, the interval T is divided into a set of overlapping gating block intervals. A gating block is a set of contiguous audio samples of duration $T_g$=400 ms, to the nearest sample. The overlap of each gating block is 75% of the gating block duration. Frequency weighting is applied, then each channel is squared. Therefore, the remaining processing is carried out on the power of the channels.

Returning to FIG. 3, in this example the audio data that is output from the downmixing operation in the second format (Dolby 5.1 in this example) is provided to the loudness measurement block 315 and to the loudness adjustment block 320. The loudness adjustment block 320 is configured to adjust the loudness of the audio data in the second format according to a loudness measurement that is output from the loudness measurement block 315. The loudness adjustment block 320 and the loudness measurement blocks 315 and 325 may, in some examples, be configured to perform one or more processes such as those described in United States Patent Application Publication 2015/0078585 A1, which is hereby incorporated by reference. According to some such processes, loudness adjustment block 320 may apply a perceptual leveling algorithm. In some examples, the loudness correction block 310 may be configured for receiving an audio signal and a desired loudness of the audio signal, removing artifacts from the audio signal, measuring an actual loudness of the audio signal, calculating a gain value using a difference between the desired loudness and the actual loudness of the audio signal, and modifying the audio signal using the gain value.

After the loudness adjustment block 320 adjusts the loudness of the audio data in the second format, the resulting loudness-corrected audio data is provided to the loudness measurement block 325. In this example, if the loudness measurement block 325 determines that the loudness-corrected audio data is compliant with Recommendation ITU-R BS.1770, loudness-corrected audio data in the second format is output from the loudness correction block 310. The loudness-corrected audio data in the second format is denoted 5.1' in FIG. 3. If the loudness measurement block 325 determines that the loudness-corrected audio data is not compliant with Recommendation ITU-R BS.1770, the loudness-corrected audio data may be further processed by the loudness adjustment block 320.

In the example shown in FIG. 3, the loudness-corrected audio data in the second format and the uncorrected audio data in the second format are provided to the correction factor determining blocks 330 and 335. In this example, the correction factor determining block 330 is configured to determine a first-format correction factor for audio data in the first format and the correction factor determining block 335 is configured to determine a second-format correction factor for audio data in the second format.

In this implementation, the correction factor determining block 335 is configured to determine a first power of the audio data in the second format (the uncorrected Dolby 5.1 data in this example) and is configured to determine a second power of the loudness-corrected audio data in the second format (the loudness-corrected audio data that is denoted Dolby 5.1' in this example). Here, the correction factor determining block 335 is configured to determine a power ratio of the first power to the second power. In this example, the correction factor determining block 335 is configured to determine and output a second-format correction factor that is based, at least in part, on the power ratio. Accordingly, in this example the correction factor determining block 335 is configured to perform the processes of blocks 220, 225 and 230 of FIG. 2, and part of the process of block 245.

According to this implementation, the correction factor determining block 330 is also configured to determine a first power of the audio data in the second format (the uncorrected Dolby 5.1 data in this example) and to determine a second power of the loudness-corrected audio data in the second format (the loudness-corrected audio data that is denoted Dolby 5.1' in this example). Here, the correction factor determining block 330 is configured to determine a power ratio of the first power to the second power.

In alternative implementations, either the correction factor determining block 330 or the correction factor determining block 335, but not both, may be configured to determine the power ratio of the first power to the second power. In such implementations the correction factor determining block 330 may be configured to provide the power ratio to the correction factor determining block 335, or vice versa.

However, in this example, the correction factor determining block 330 is also configured to receive the audio data in the first format (Dolby 5.1.2 in this example) and to determine a power relationship between the audio data in the first format and the audio data in the second format. In the example shown in FIG. 3, the correction factor determining block 330 is configured to determine the power relationship by receiving power relationship information in the form of g, which represents metadata corresponding to the relative power of height speakers as compared to the power of other channels of the 5.1.2-formatted audio data. The value of g may be set by a content creator or by another person involved in producing the 5.1.2-formatted audio data. Dolby 5.1.2-formatted audio data has a left height speaker channel and a right height speaker channel. In some examples, the value of g may indicate the number of decibels by which the level of an audio signal for the left height speaker channel will be reduced before mixing the audio signal for the left height speaker channel into the signal for the left surround speaker. According to some implementations, the value of g may also indicate the number of decibels by which the level of an audio signal for the right height speaker channel will be reduced before mixing the audio signal for the right height speaker channel into the signal for the right surround speaker.

According to this implementation, the correction factor determining block 330 is configured to determine and output a first-format loudness correction factor for the audio data in the first format. In this example, the first-format loudness correction factor is based, at least in part, on the power ratio and the power relationship. Accordingly, in this example the correction factor determining block 330 is configured to perform the processes of blocks 235 and 240 of FIG. 2, as well as part of the process of block 245.

The first-format correction factor and the second-format correction factor may be encoded with the audio data in the first and second formats. At the time of playback, a device (such as a device of a reproduction environment) may decode the audio data of the first format or the audio data of the second format, and apply a loudness correction process according to the first-format correction factor or the second-format correction factor.

According to some examples wherein the first format is Dolby 5.1.2 and the second format is Dolby 5.1, the correction factor determining block 330 may be configured to determine the first-format loudness correction factor based on the weighted loudness of the Dolby 5.1 input, the corrected output of the Dolby 5.1 audio data, and a partial correction factor. According to some such examples, the correction factor determining block 330 may be configured to determine the first-format loudness correction factor according to the following equation:

$$\text{RTLL\_Comp\_512} = L\_510\_\text{corrected}/(L\_510\_\text{input} - \text{PartialcorrectionFactor}) \quad \text{(Equation 3)}$$

In Equation 3, RTLL_Comp_512 represents the correction factor needed to correct 5.1.2 input content to a target loudness, $L\_\mathbf{510}\_\text{corrected}$ represents the mean square of the weighted power of the corrected 5.1 audio data (for example, the average power across an audio frame wherein the signals for the left and right surround speakers are weighted by 1.5 dB) and $L\_\mathbf{510}\_\text{input}$ represents the mean square of the weighted power of the input 5.1 audio data (for example, the average power across an audio frame wherein the signals for the left and right surround speakers are weighted by 1.5 dB).

In one example, the PartialcorrectionFactor of Equation 3 may be expressed as follows:

$$\text{PartialcorrectionFactor} = (1.414*g^2 - 1)*(Lts^2 + Rts^2) \quad \text{(Equation 4)}$$

In Equation 4, g represents the relationship used to mix 5.1.2 height channels into the target 5.1 surround channels, as described elsewhere herein. In Equation 4, Lts and Rts represent the levels of the left and right "top surround" channels, respectively. The top surround channels are also referred to herein as height channels.

According to some alternative implementations, the correction factor determining block 330 may be configured to determine the first-format loudness correction factor based on the weighted loudness of the Dolby 5.1 input, the corrected output of the Dolby 5.1 audio data, and a full correction factor. According to some such examples, the correction factor determining block 330 may be configured to determine the first-format loudness correction factor according to the following equation:

$$\text{RTLL\_Comp\_512} = L\_510\_\text{corrected}/(L\_510\_\text{input} - \text{FullcorrectionFactor}) \quad \text{(Equation 5)}$$

Except for the "FullcorrectionFactor," the other variables of Equation 5 are as described above with reference to Equation 3. In some implementations, the FullcorrectionFactor may be determined as follows:

$$\text{FullcorrectionFactor} = [(1.414*g^2 - 1)*(Lts^2 + Rts^2) + (2.828*g)*(Lts*Ls + Rts*Rs)] \quad \text{(Equation 6)}$$

In Equation 6, Ls represents the level of the left surround channel and Rs represents the level of the right surround channel.

The foregoing paragraphs describe examples of how the loudness correction factors for Dolby 5.1 and 5.1.2 audio data may be calculated in an encoder for transmission, along with encoded audio data, in a bitstream. The value of g, used in the creation of the 5.1 program, controls the amount of energy from the overhead loudspeakers that is mixed into the main loudspeakers.

However, in some implementations the value of g may be controlled on the decoder side. According to some implementations, the loudness correction factors may be calculated and applied in a decoder without running the entire loudness correction process again. The loudness corrections factors received by a decoder are based on the program mixes that were encoded, but in certain circumstances, the mixes may be adjusted in the decoder by the operator or user. This level of control can provide the user with a personalized mix of the program. For example, the downmix factor g may be adjusted, and therefore a modification or adaption of the loudness correction factors would preferably be made. Similarly, where separate audio streams, carrying different program parts, music and effect, various dialog tracks and the user may adjust those levels. Modification of the loudness correction factors at the decoder side can be made in order to account for such changes.

If the user were to choose to set a value of g that is different from the value that was used to calculate a loudness correction factor (or that was used to calculate loudness-corrected output) that was transmitted with Dolby audio data, the correction factor would preferably be re-calculated/adjusted accordingly to account for the change. According to some examples, the correction factor for Dolby 5.1-formatted audio data may be adjusted on the decoder side by using a correction factor for Dolby 5.1.2-formatted transmitted in the bitstream that included the audio data received by the decoder.

According to one such example, the correction factor for Dolby 5.1-formatted audio data may be adjusted on the decoder side by implementing a rearranged version of Equation 3 or Equation 5, depending on how the received loudness correction factors were calculated. For example, assuming that the received loudness correction factors were calculated according to Equation 3, the corrected output for Dolby 5.1-formatted audio data may be determined on the decoder side by implementing the following equation:

$$L\_510\_corrected = RTLL\_Comp\_512 * ((L\_510\_input - PartialcorrectionFactor)) \quad \text{(Equation 7)}$$

The "PartialcorrectionFactor" of Equation 7 may, for example, be determined according to Equation 4. If so, the PartialcorrectionFactor is based in part on the value of g. Therefore, if g is adjusted on the decoder side (e.g., according to input received from a user via a user interface), in some examples the correction factor for Dolby 5.1-formatted audio data may be adjusted on the decoder side by implementing Equation 7. According to some examples, a control system of a decoder apparatus (such as the control system 115 illustrated in FIG. 1) may determine the correction factor for Dolby 5.1-formatted audio data input based, at least in part, on a value of g that is selected by a user and input via a user interface (which may be part of the interface system 110 illustrated in FIG. 1).

In order to avoid sending/transmitting separate complete audio programs, such as an English 5.1 channel program and a French 5.1 channel program, one could send/transmit the 5.1 channel M&E separately from the language channels. The mixing of the program could be carried out in the playback device. Mixing metadata could be carried along with the audio so that in the playback device, the program is mixed to the content creators' intent for each specific presentation. Next-generation audio formats support multiple presentations and therefore allow for the efficient carriage of audio programs, where elements are encoded separately, not mixed prior to encoding, but rather mixed on the playback device after decoding.

For example, a broadcast could include two presentations that both use the same 5.1 M&E (music and effects) channels. However, one may have an English dialog track and the other may have a French dialog track. This would reduce the data rate needed to deliver a 5.1 English and 5.1 French program, because one would only need to deliver one 5.1 M&E plus 2 mono channels, as opposed to two 5.1 programs. The foregoing example could be extended for more complex presentations as shown below, where additional associated dialog elements may be included.

In the following examples, CM represents the complete main program, ME represents music and effects, D represents dialog and AD represents associated dialog.

In one example, a broadcast could include CM5.1 plus CM5.1 with AD. In another example, a broadcast could include ME5.1+Dmono+Dmono+ADmono+ADmono. In another example, a broadcast could include 5.1 M&E+1 English+1 French (in three elements/substreams). In another instance, a broadcast could include 5.1 M&E+1 English+1 English AD+1 French+1 French AD (in 5 elements/substreams).

Whether presentations are carried as separate 5.1 mixes or carried as pre-mixed elements, the loudness of the presentation will generally need to be measured. According to previously-disclosed methods, when two presentations were to be measured the entire process had to be carried out twice, once for each presentation, even though both presentations were based on the same 5.1 M&E. When more and more presentations are used, more and more loudness measurements need to be carried out and the complexity increases.

Loudness normalization, wherein the actual audio of the program is adjusted/offset so that the program loudness matches a specific target, is not straightforward when dealing with multiple presentations with common audio elements. For example, in a simple case with a 5.1 channel M&E and two dialog elements, English and French, one could correct the loudness of the M&E plus English dialog mix, but that does not guarantee that the M&E plus French dialog mix would be at the proper loudness.

Accordingly, with the delivery of more than one mix of an audio program, whether the mixes are delivered as separate single presentations or as multiple presentation streams as highlighted above, multiple loudness measurements will generally need to be carried out. For example, if there is a 5.1 M&E element along with English and French dialog elements and accompanying video description, according to previously-disclosed methods four 5.1 channel mixes would need to be measured.

Some disclosed implementations exploit the fact that the multiple mixes contain common audio elements, such as a common 5.1 M&E element. Some such implementations allow the measurement of the loudness of the various mixes to be simplified and can reduce the complexity of the process. Accordingly, the complexity of loudness measurement and loudness control may be reduced.

For presentations that have similar audio elements, some implementations do not duplicate the processing of such elements when loudness measurement of the presentations is done. By carrying out as much of the audio processing as possible before the audio elements are mixed to create a presentation, the complexity of the loudness measurement may be reduced and a more efficient loudness measurement engine may be created.

For example, when measuring the loudness of two programs that include the same 5.1 M&E, the filtering of each channel of the 5.1 M&E and application of the spatial gains need only be done once prior to mixing. This process can allow a more efficient loudness measurement. According to some such examples, all the linear processing of a loudness measurement process may be done before the mixing of the audio to create presentations and then further processing, including non-linear processing, may be done on the mixed presentations to measure the loudness. In some such examples, the accuracy or precision of the loudness measurement results are consistent with those that would be achieved when applying the methods outlined in Recommendation ITU-R BS.1770.

Figure 5:
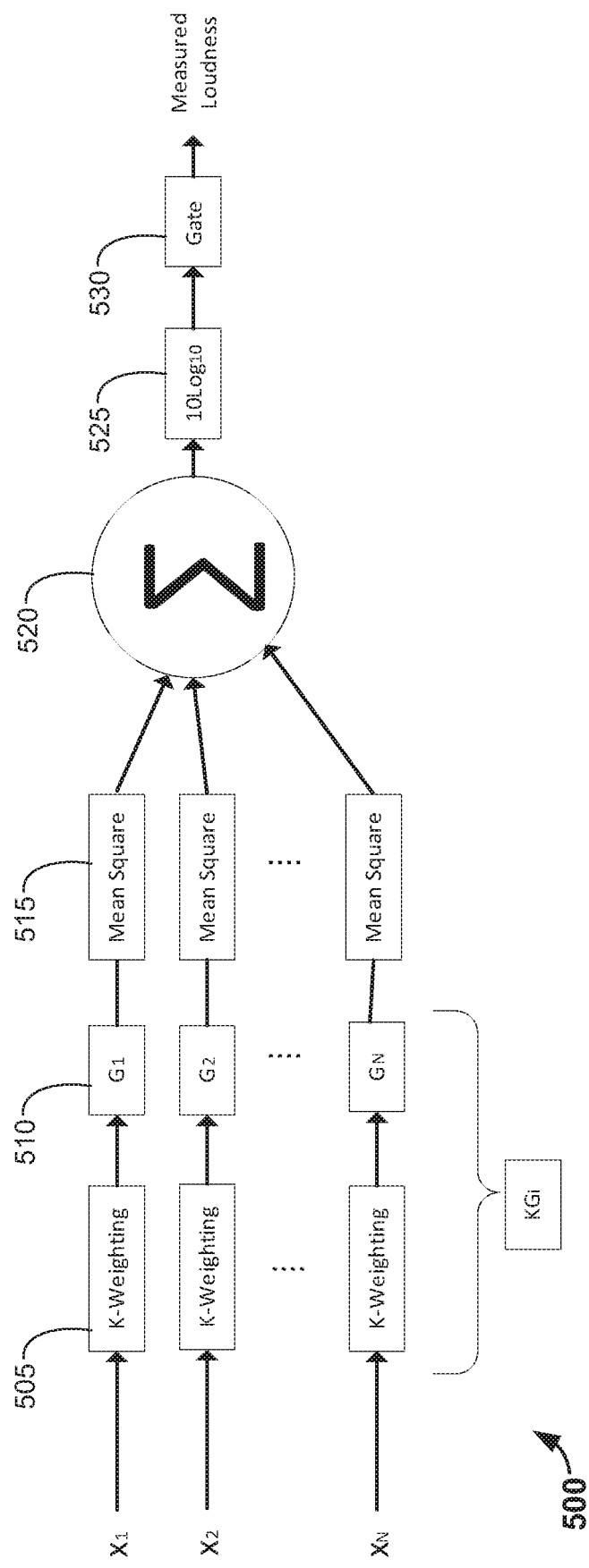
FIG. 5 is a block diagram that represents a modified version of the loudness measurement process outlined in Recommendation ITU-R BS.1770.

FIG. 5 is a block diagram that represents a modified version of the loudness measurement process outlined in Recommendation ITU-R BS.1770. In this example, blocks 505, 520, 525 and 530 of method 500 are performed in the same manner as blocks 405, 420, 425 and 430 of the method shown in FIG. 4A. However, recognizing the linear versus non-linear processing operations of the algorithm outlined in Annex 1, the spatial gain block 510 is performed before the mean square block 515 in the example shown in FIG. 5, whereas the order of the two corresponding blocks is reversed in FIG. 4A.

Figure 6:
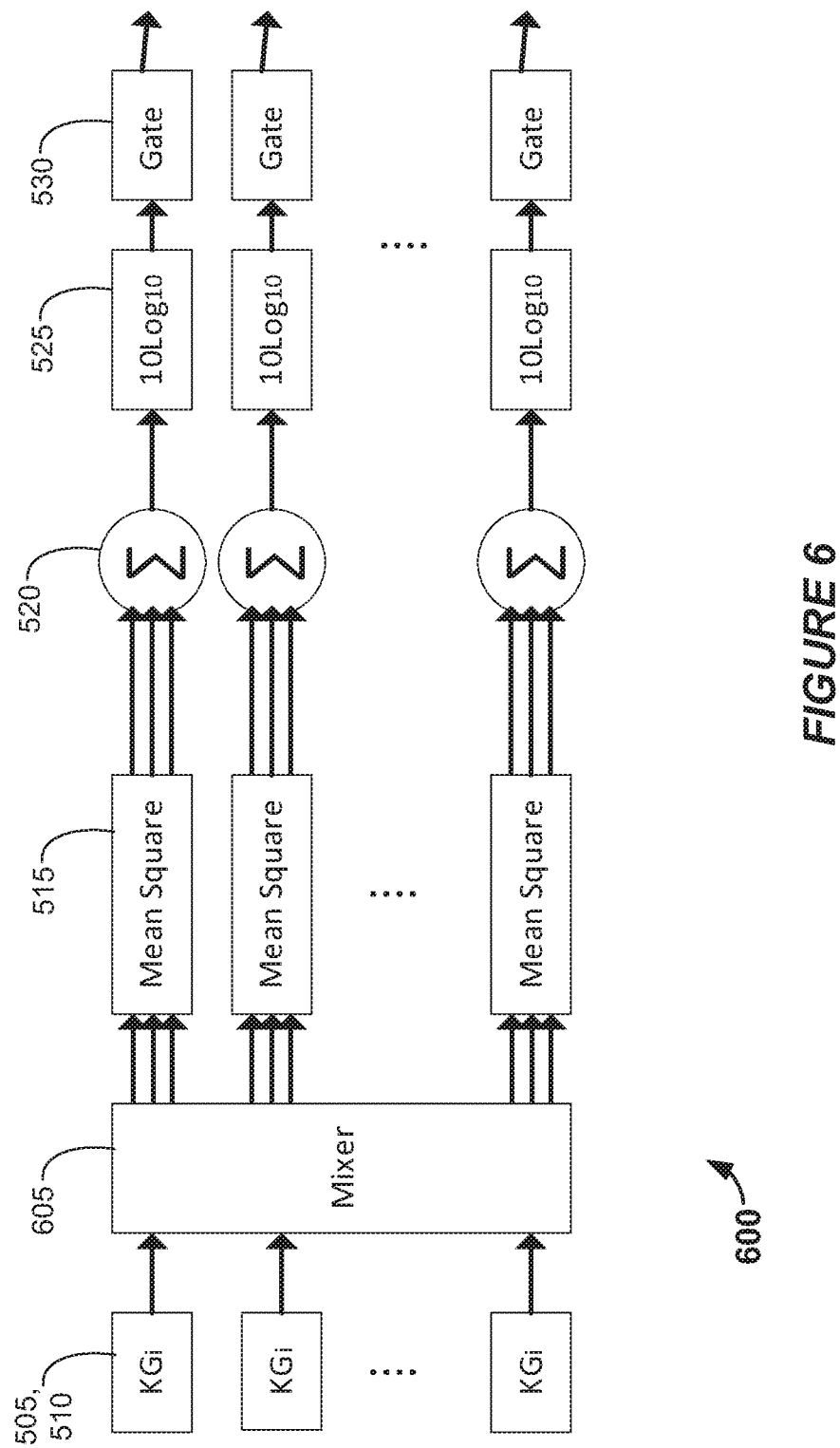
FIG. 6 is a block diagram that represents another modified version of the loudness measurement process outlined in Recommendation ITU-R BS.1770.

FIG. 6 is a block diagram that represents another modified version of the loudness measurement process outlined in Recommendation ITU-R BS.1770. In this example, the processes represented by blocks 515, 520, 525 and 530 of FIG. 6 are the same as the processes represented by blocks 515, 520, 525 and 530 of FIG. 5. However, in this example the linear processes of blocks 505 and 510 are represented in combined KGi blocks. Moreover, a new mixer block 605 has been introduced between the KGi blocks and the mean square blocks 515. Accordingly, in this example the operations of the mixer block 605 are performed after the linear operations of the KGi blocks and before the subsequent non-linear operations. The operations of the mixer block 605 may involve upmixing or downmixing, depending on the particular implementation.

Figure 7:
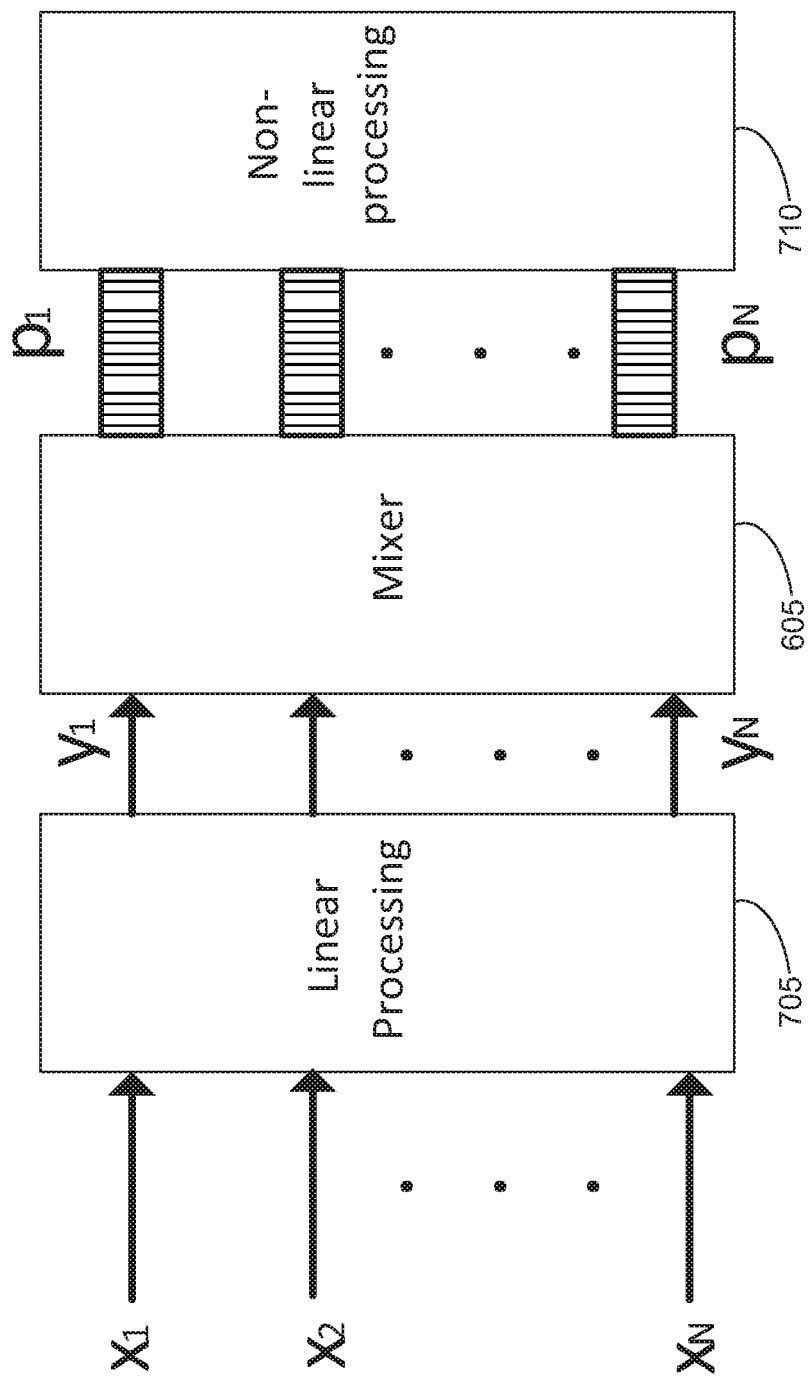
FIG. 7 is a block diagram that represents a more generalized version of the method of FIG. 6.

FIG. 7 is a block diagram that represents a more generalized version of the method of FIG. 6. In this example, audio data for channels $X_1$-$X_N$ are input to a linear audio processing block 705. In some examples, the linear audio processing block 705 may correspond with the KGi blocks shown in FIG. 6. According to this implementation, processed audio data $Y_1$-$Y_N$ are output from the linear audio processing block 705 and provided to the mixer block 605. Here, mixed audio data $Y_1$-$Y_N$ are output from the mixer block 605 and provided to the non-linear audio processing block 710. In some examples, the non-linear audio processing block 710 may correspond with one or more of blocks 515-530 of FIG. 6.

Figure 8:
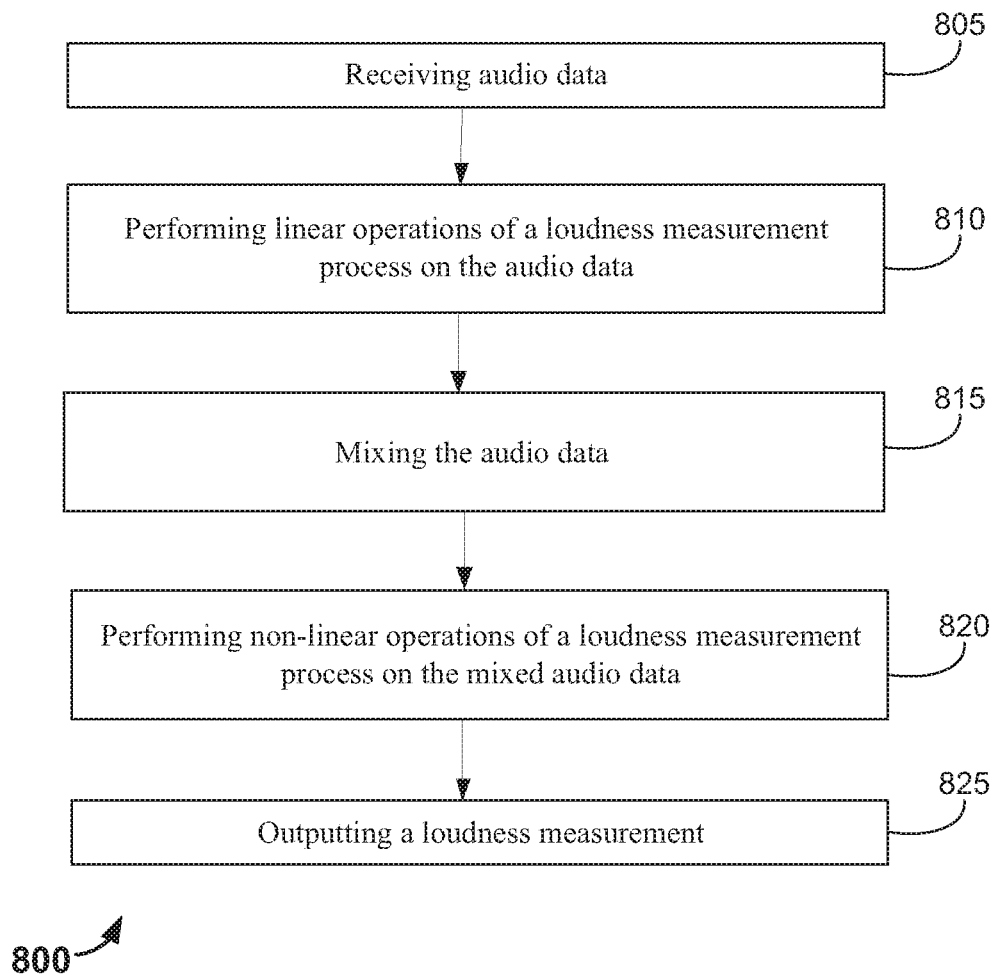
FIG. 8 is a flow diagram that outlines blocks of one example of the method that is outlined in FIG. 7.

FIG. 8 is a flow diagram that outlines blocks of one example of the method that is outlined in FIG. 7. The method may, in some instances, be performed by the apparatus of FIG. 1 or by another type of apparatus disclosed herein. In some examples, the blocks of method 800 may be implemented via software stored on one or more non-transitory media. The blocks of method 800, like other methods described herein, are not necessarily performed in the order indicated. Moreover, such methods may include more or fewer blocks than shown and/or described.

In this implementation, block 805 involves receiving audio data. Block 805 may, for example, involve a control system (such as the control system 115 of FIG. 1) receiving the audio data via an interface system (such as the interface system 110 of FIG. 1).

Here, block 810 involves performing linear operations on the audio data. According to this example, block 810 involves performing linear operations of a loudness measurement process on the audio data. According to some implementations, block 810 may involve processes like those of the linear audio processing block 705 and/or the KGi blocks of FIG. 6.

In this example, block 815 involves mixing the audio data. Block 815 may involve an upmixing process or a downmixing process, depending on the particular implementation.

Here, block 820 involves performing non-linear operations on the mixed audio data that is output from the operations of block 815. According to this example, block 820 involves performing non-linear operations of a loudness measurement process on the mixed audio data. According to some implementations, block 820 may involve processes like those of the non-linear audio processing block 710 of FIG. 7. In this example, block 825 involves outputting a loudness measurement.

Figure 9A:
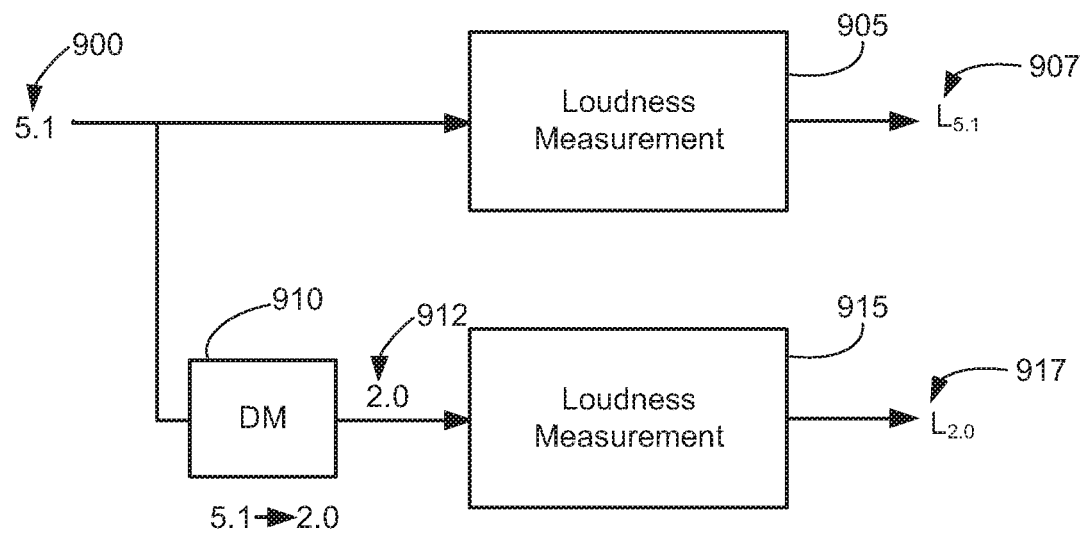
FIG. 9A is a block diagram that represents conventional processes of downmixing and loudness measurement.

A processing flow like that described above with reference to FIGS. 6-8 has potential advantages, some examples of which will now be described with reference to FIGS. 9A-10. FIG. 9A is a block diagram that represents conventional processes of downmixing and loudness measurement. In this example, audio data 900 in Dolby 5.1 format is input to a loudness measurement block 905 and to a downmixing block 910. The loudness measurement block 905 outputs a loudness measurement 907 for the audio data 900.

The downmixing block 910 outputs downmixed audio data 912, which is 2-channel audio data in this example. The loudness measurement block 915 receives the downmixed audio data 912 and outputs a loudness measurement 917 for the downmixed audio data 912. The loudness measurement blocks 905 and 915 may, for example, measure the loudness of the input audio data according to the loudness measurement process outlined in Annex 1 of Recommendation ITU-R BS.1770, as described above with reference to FIG. 4A.

Figure 9B:
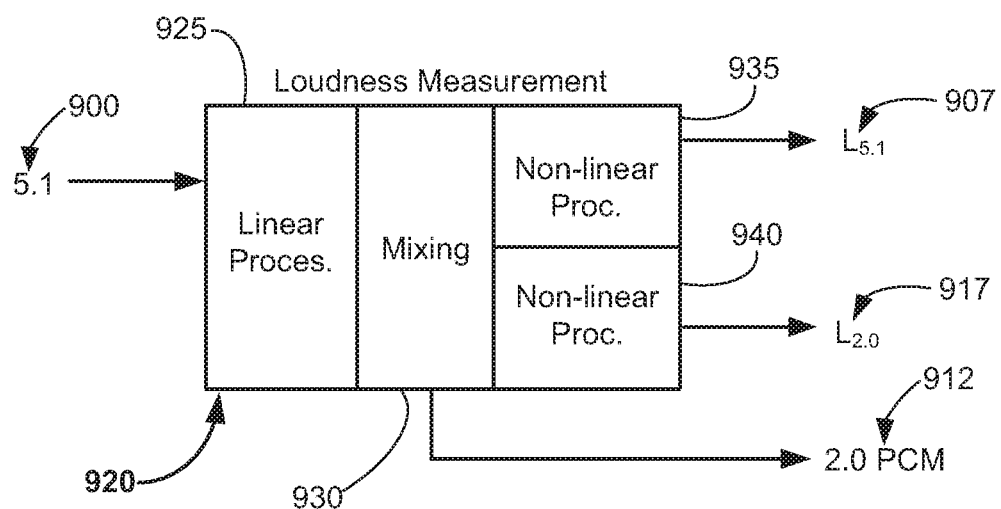
FIG. 9B is a block diagram that represents examples of novel downmixing and loudness measurement processes.

FIG. 9B is a block diagram that represents examples of novel downmixing and loudness measurement processes. In this example, audio data 900 in Dolby 5.1 format is input to a loudness measurement block 920. According to this example, the linear processing block 925 of loudness measurement block 920 performs linear operations of a loudness measurement process. The linear processing block 925 may, for example, correspond to the $KG_i$ blocks that are described above with reference to FIG. 6.

The output of the linear processing block 925 is provided to the mixing block 930. The mixing block 930 may include functionality like that of the mixer 605 that is described above with reference to FIG. 6. According to this implementation, the mixing block 930 provides audio data in Dolby 5.1 format to non-linear processing block 935 and audio data in Dolby 2.0 format to non-linear processing block 940.

In this implementation, the non-linear processing block 935 outputs a loudness measurement 907 for the audio data in Dolby 5.1 format and the non-linear processing block 940 outputs a loudness measurement 917 for the audio data in Dolby 2.0 format. The non-linear processing blocks 935 and 940 may, for example, include processes that correspond to blocks 515-530 of FIG. 6. In this example, the mixing block 930 also outputs audio data in Dolby 2.0 format.

As compared to the loudness measurement processes that are described above with reference to FIG. 9A, the loudness measurement processes of FIG. 9B require fewer linear processing steps. Accordingly, the loudness measurement processes of FIG. 9B are relatively more efficient.

Figure 10:
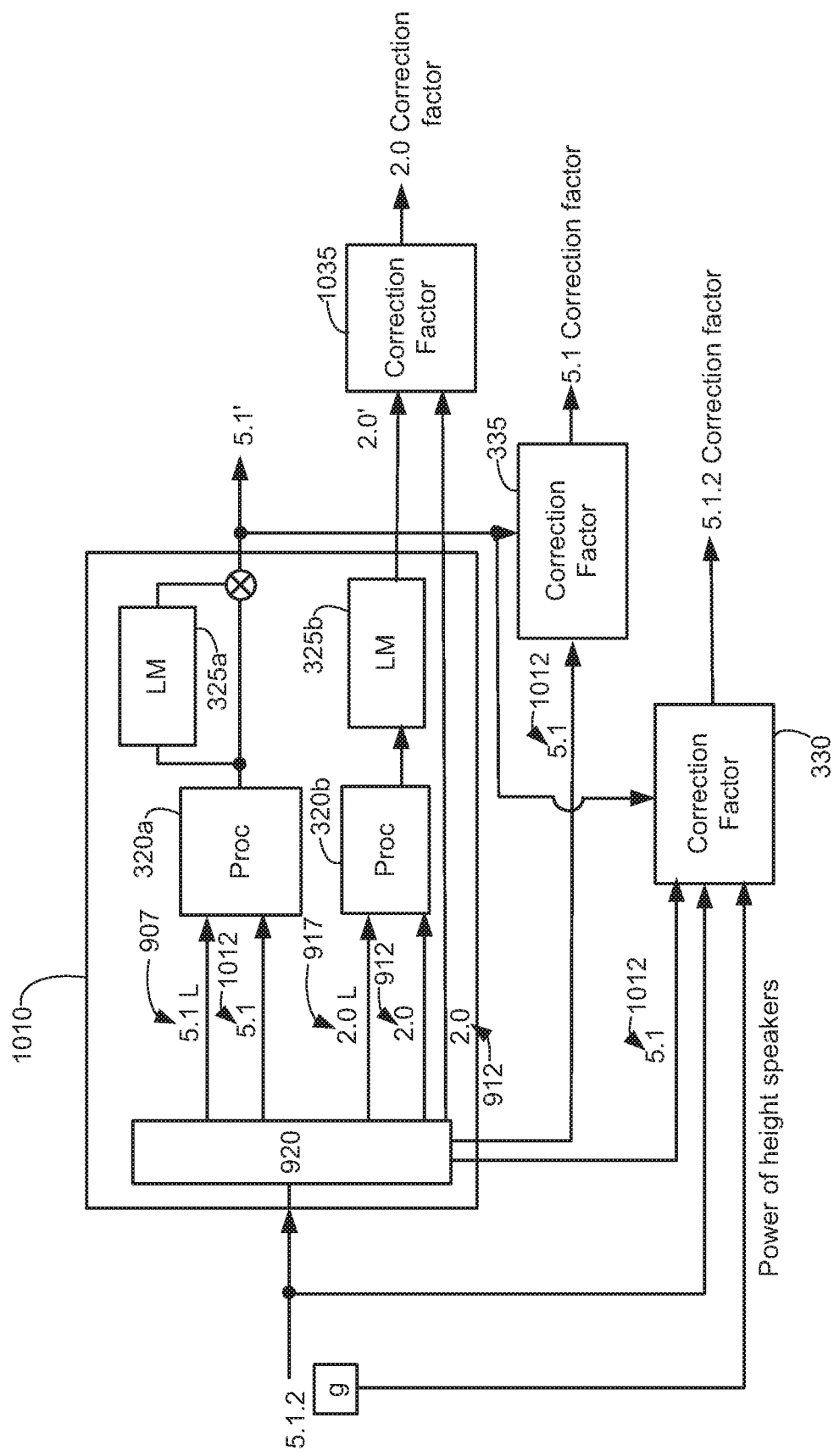
FIG. 10 is a block diagram that shows an alternative example of the processes that are outlined in FIGS. 2 and 3.

FIG. 10 is a block diagram that shows an alternative example of the processes that are outlined in FIGS. 2 and 3. According to this example, the audio data in the first format, which is Dolby 5.1.2 in this instance, is received by a loudness measurement block 920 of the loudness correction block 1010 instead of the separate downmixing block 305 shown in FIG. 3. This is an example of block 205 of FIG. 2.

As described above with reference to FIG. 9B, the loudness measurement block 920 includes a mixing block 930 that is not shown in FIG. 10. In this implementation, the audio data in the first format is downmixed by the loudness measurement block 920 to produce audio data 1012 in a second format, which is Dolby 5.1 in this example. This is an example of block 210 of FIG. 2. According to this example, the audio data in the first format is also downmixed by the loudness measurement block 920 to produce audio data 912 in a third format, which is Dolby 2.0 in this example.

In this implementation, the loudness measurement block 920 outputs a loudness measurement 907 for the audio data in Dolby 5.1 format and a loudness measurement 917 for the audio data in Dolby 2.0 format, e.g., as described above with reference to FIG. 9B. In this example, the loudness measurement 907 and the audio data 1012 in Dolby 5.1 format are input to the loudness adjustment block 320a, whereas the loudness measurement 917 and the audio data 912 in Dolby 2.0 format are input to the loudness adjustment block 320b. The loudness adjustment blocks 320a and 320b may involve substantially the same operations as the loudness adjustment block 320 of FIG. 3.

The output of the loudness adjustment blocks 320a and 320b are provided to the loudness measurement blocks 325a and 325b, respectively. The loudness measurement blocks 325a and 325b may involve substantially the same operations as the loudness measurement block 325 of FIG. 3. In this example, the loudness correction block 1010 outputs loudness-corrected audio data in Dolby 5.1 format, which is denoted Dolby 5.1' in this example, as well as loudness-corrected audio data in Dolby 2.0 format.

In this example, the correction factor determining blocks 330 and 335 involve processes that are substantially similar to those of the correction factor determining blocks 330 and 335 that are described above with reference to FIG. 3. The implementation shown in FIG. 10 also includes a correction factor determining block 1035, which is configured to determine a first power of the audio data in the third format (the uncorrected Dolby 2.0 data in this example) and is configured to determine a second power of the loudness-corrected audio data in the third format (the loudness-corrected audio data that is denoted Dolby 2.0' in this example). Here, the correction factor determining block 1035 is configured to determine a power ratio of the first power to the second power. In this example, the correction factor determining block 335 is configured to determine and output a third-format correction factor that is based, at least in part, on the power ratio.

Various modifications to the implementations described in this disclosure may be readily apparent to those having ordinary skill in the art. For example, some implementations may involve downsampling the audio, e.g., by a factor of 2, and running the loudness metering processing at a sub-rate. In this manner, complexity may be reduced. By only decimating and not including a low-pass-filter for proper sample-rate conversion, the energy of the frequencies above the new Nyquist frequency are not lost but folded down. This may be useful for power-based measurements, where it reduces the number of samples (e.g., by half) while retaining the power represented by substantially all frequencies.

For example, if one were to downsample the audio signal by dropping every other sample without any low-pass filter, the signal above fs/4 (half of the sampling frequency) would be aliased or folded back. The loudness measurement process outlined in Recommendation ITU-R BS.1770 is based on the average power of the audio signal. Without any frequency-weighting, the only energy lost would be at fs/4. The power of the signal above fs/4 would be "folded-over" or aliased and preserved. When there is a frequency-weighting (e.g., with the K-weighting filter that is applied in loudness measurement process outlined in Recommendation ITU-R BS.1770), the energy will not be preserved, but instead will be frequency-weighted according to how the frequencies are aliased. A difference in the frequency-weighting would occur where the signal would be mirrored, which would be around fs/4.

Figure 11:
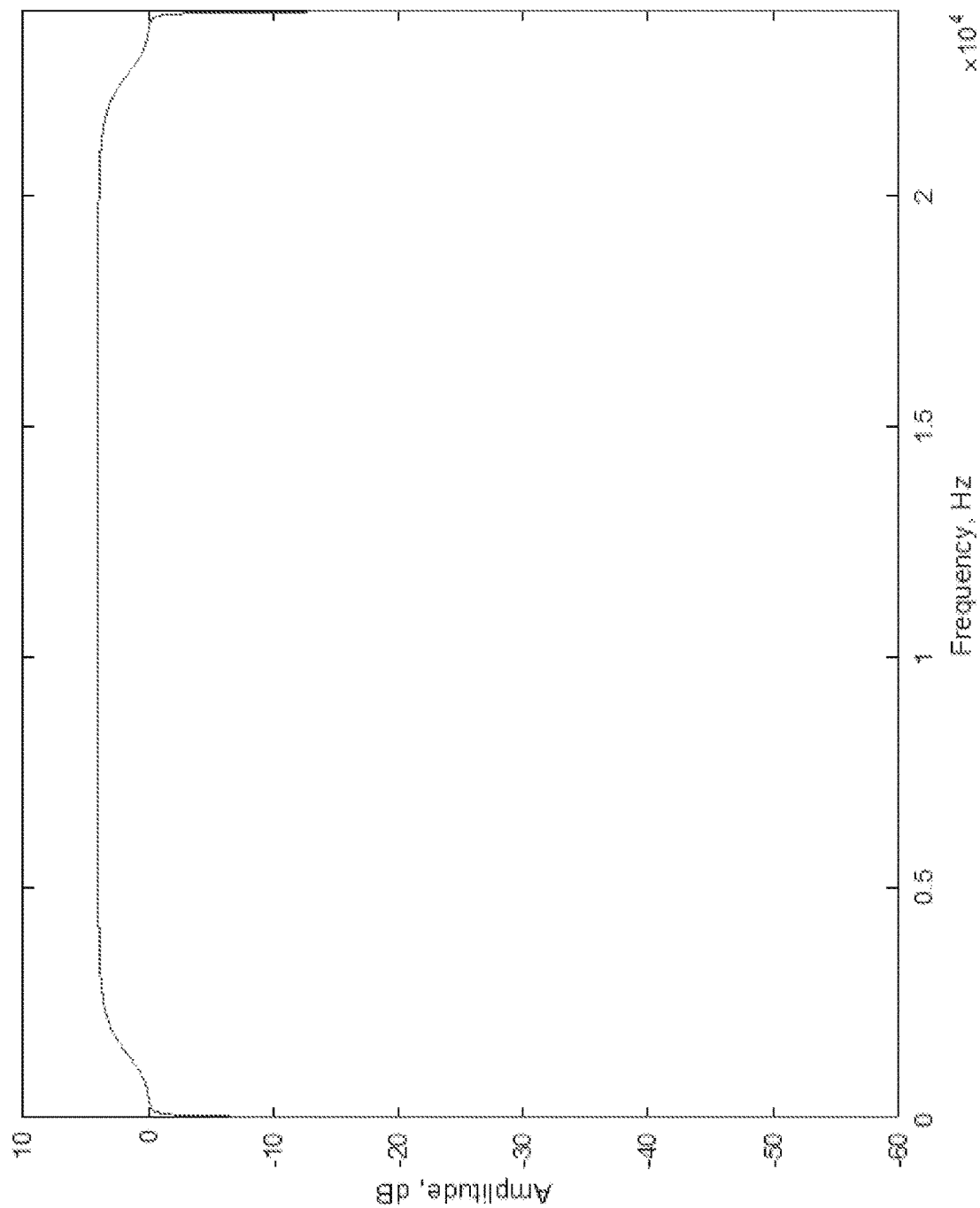
FIG. 11 illustrates the approximate weighting for a down-sampled audio signal according to one example.

FIG. 11 illustrates the approximate weighting for a down-sampled audio signal according to one example. In this example, which is for a sampling frequency fs of 48 kHz, 24 kHz would be mapped to 0, 14 kHz would be mapped to 10 kHz, etc. Carrying out the downsampling reduces the complexity, by running the BS.1770 algorithm on half the samples, and will result in an acceptable approximation for most actual audio signals, because the main difference is at frequencies higher than about 21 Khz.

The general principles defined herein may be applied to other implementations without departing from the scope of this disclosure. Thus, the claims are not intended to be limited to the implementations shown herein, but are to be accorded the widest scope consistent with this disclosure, the principles and the novel features disclosed herein.

Various aspects of the present invention may be appreciated from the following enumerated example embodiments (EEEs):

EEE1. An audio processing method, comprising:
 receiving audio data in a first format;
 processing the audio data in the first format to produce audio data in a second format, the second format being a reduced or simplified version of the first format;
 performing a loudness correction process on the audio data in the second format to produce loudness-corrected audio data in the second format;
 determining a first power of the audio data in the second format;
 determining a second power of the loudness-corrected audio data in the second format;
 determining a second-format loudness correction factor for the audio data in the second format, the second-format loudness correction factor being based, at least in part, on a power ratio of the first power to the second power;
 determining a power relationship between the audio data in the first format and the audio data in the second format;
 determining a first-format loudness correction factor for the audio data in the first format, the first-format loudness correction factor being based, at least in part, on the power ratio and the power relationship; and outputting the first-format loudness correction factor and the second-format loudness correction factor.

EEE2. The method of EEE 1, wherein the first format is a first channel-based format and wherein the second format is a downmix of the first channel-based format.

EEE3. The method of EEE 2, wherein the power relationship corresponds to a difference between a power of the audio data in the first channel-based format and a power of the audio data of the downmix.

EEE4. The method of any one of EEEs 1-3, wherein the first format includes audio data for height speakers and wherein the second format does not include audio data for height speakers.

EEE5. The method of EEE 4, wherein the power relationship corresponds to a power of the audio data for the height speakers.

EEE6. The method of any one of EEEs 1-5, wherein the loudness correction process involves a first loudness measurement process, a loudness adjustment process and a second loudness measurement process.

EEE7. The method of EEE 6, wherein the first loudness measurement process involves one or more linear processing operations, followed by a mixing operation, followed by one or more non-linear processing operations.

EEE8. The method of EEE 7, wherein the linear processing operations include applying a K-weighting filter and applying a spatial gain.

EEE9. The method of EEE 7, wherein the mixing operation includes a downmixing operation that produces third audio data in a third format, the third format being a reduced or simplified version of the second format.

EEE10. The method of EEE 7, wherein the audio data in the second format includes dialogue audio data and music and audio effects (M&E) audio data.

EEE11. The method of EEE 10, wherein the dialogue audio data includes dialogue audio data for a plurality of languages and wherein the linear processing operations are performed separately on the dialogue audio data for each of the plurality of languages.

EEE12. The method of EEE 10, wherein the linear processing operations for the M&E audio data are performed separately from the linear processing operations for the dialogue audio data.

EEE13. The method of any one of EEEs 1-12, wherein the first format is an audio object format and wherein the second format is a simplified version of the first format.

EEE14. The method of any one of EEEs 1-13, wherein the audio data in the first format includes at least a first dialogue and M&E audio data.

EEE15. One or more non-transitory media having software stored thereon, the software including instructions for performing the method recited in any one of EEEs 1-14.

EEE16. An apparatus including a control system configured to perform the method recited in any one of EEEs 1-14.

EEE17. An audio processing method, comprising:
  receiving a first-format loudness correction factor for audio data in a first format and a received second-format loudness correction factor for audio data in a second format;
  receiving the audio data in the first format;
  receiving an indication of a revised power relationship between the audio data in the first format and the audio data in the second format; and
  adjusting the received second-format loudness correction factor based, at least in part, on the first-format loudness correction factor and the revised power relationship.

EEE18. The audio processing method of EEE 17, wherein the audio data in the second format is a downmix or a render of the audio data in the first format.

EEE19. The audio processing method of EEE 18, wherein the revised power relationship is an alteration of an original power relationship and wherein the original power relationship indicates how a level of audio data corresponding with a channel of the first format has been altered during a downmixing process that produced the audio data in the second first format.

EEE20. The audio processing method of any one of EEEs 17-19, wherein the second format is a Dolby 5.1 format and the first format is a Dolby 5.1.2 format.

EEE21. The audio processing method of any one of EEEs 17-20, wherein the second format is a Dolby 5.1 format and the first format is a Dolby 7.1.4 format.

What is claimed is:

1. An audio processing method, comprising:
  receiving audio data in a first format;
  processing the audio data in the first format to produce audio data in a second format, the second format being a reduced or simplified version of the first format;
  performing a loudness correction process on the audio data in the second format to produce loudness-corrected audio data in the second format;
  determining a first power of the audio data in the second format;
  determining a second power of the loudness-corrected audio data in the second format;
  determining a second-format loudness correction factor for the audio data in the second format, the second-format loudness correction factor being based, at least in part, on a power ratio of the first power to the second power;
  determining a power relationship between the audio data in the first format and the audio data in the second format;
  determining a first-format loudness correction factor for the audio data in the first format, the first-format loudness correction factor being based, at least in part, on the power ratio and the power relationship; and
  outputting the first-format loudness correction factor and the second-format loudness correction factor.

2. The method of claim 1, wherein the first format is a first channel-based format and wherein the second format is a downmix of the first channel-based format.

3. The method of claim 2, wherein the power relationship corresponds to a difference between a power of the audio data in the first channel-based format and a power of the audio data of the downmix.

4. The method of claim 1, wherein the first format includes audio data for height speakers and wherein the second format does not include audio data for height speakers.

5. The method of claim 4, wherein the power relationship corresponds to a power of the audio data for the height speakers.

6. The method of claim 1, wherein the loudness correction process involves a first loudness measurement process, a loudness adjustment process and a second loudness measurement process.

7. The method of claim 6, wherein the first loudness measurement process involves one or more linear processing operations, followed by a mixing operation, followed by one or more non-linear processing operations.

8. The method of claim 7, wherein the linear processing operations include applying a K-weighting filter and applying a spatial gain.

9. The method of claim 7, wherein the mixing operation includes a downmixing operation that produces third audio data in a third format, the third format being a reduced or simplified version of the second format.

10. The method of claim 7, wherein the audio data in the second format includes dialogue audio data and music and audio effects (M&E) audio data.

11. The method of claim 10, wherein the dialogue audio data includes dialogue audio data for a plurality of languages and wherein the linear processing operations are performed separately on the dialogue audio data for each of the plurality of languages.

12. The method of claim 10, wherein the linear processing operations for the M&E audio data are performed separately from the linear processing operations for the dialogue audio data.

13. The method of claim 1, wherein the first format is an audio object format and wherein the second format is a simplified version of the first format.

14. The method of claim 1, wherein the audio data in the first format includes at least a first dialogue and M&E audio data.

15. One or more non-transitory media having software stored thereon, the software including instructions for performing the method recited in claim 1.

16. An apparatus including a control system configured to perform the method recited in claim 1.

17. An audio processing method, comprising:
- receiving a first-format loudness correction factor for audio data in a first format and a received second-format loudness correction factor for audio data in a second format;
- receiving the audio data in the first format;
- receiving an indication of a revised power relationship between the audio data in the first format and the audio data in the second format; and
- adjusting the received second-format loudness correction factor based, at least in part, on the first-format loudness correction factor and the revised power relationship.

18. The audio processing method of claim 17, wherein the audio data in the second format is a downmix or a render of the audio data in the first format.

19. The audio processing method of claim 18, wherein the revised power relationship is an alteration of an original power relationship and wherein the original power relationship indicates how a level of audio data corresponding with a channel of the first format has been altered during a downmixing process that produced the audio data in the second first format.

20. The audio processing method of claim 17, wherein the second format is a Dolby 5.1 format and the first format is a Dolby 5.1.2 format or a Dolby 7.1.4. format.

* * * * *